(12) United States Patent
Shiraishi et al.

(10) Patent No.: US 8,368,206 B2
(45) Date of Patent: Feb. 5, 2013

(54) HEAT RADIATION PACKAGE AND SEMICONDUCTOR DEVICE

(75) Inventors: Akinori Shiraishi, Nagano (JP); Kei Murayama, Nagano (JP); Yuichi Taguchi, Nagano (JP); Masahiro Sunohara, Nagano (JP); Mitsutoshi Higashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 572 days.

(21) Appl. No.: 12/187,641

(22) Filed: Aug. 7, 2008

(65) Prior Publication Data

US 2009/0039379 A1 Feb. 12, 2009

(30) Foreign Application Priority Data

Aug. 10, 2007 (JP) ................. 2007-208883

(51) Int. Cl.
*H01L 33/64* (2010.01)
(52) U.S. Cl. ................. 257/713; 257/724; 257/E21.503
(58) Field of Classification Search .......... 257/276, 257/675, 80–103, 413–433, 778, E33.056, 257/E33.058, E33.066, 64, 758, E21.503, 257/713–724; 438/23, 25, 26, 27, 28, 29, 438/42, 107, 108, 116, 119
See application file for complete search history.

(56) References Cited

U.S. PATENT DOCUMENTS

| | | | | |
|---|---|---|---|---|
| 5,990,550 | A * | 11/1999 | Umezawa | 257/712 |
| 6,531,328 | B1 * | 3/2003 | Chen | 438/26 |
| 6,535,396 | B1 | 3/2003 | Degenkolb et al. | 361/775 |
| 7,218,041 | B2 * | 5/2007 | Isoda | 313/11 |
| 2001/0030866 | A1 * | 10/2001 | Hochstein | 362/294 |
| 2002/0042156 | A1 * | 4/2002 | Chen | 438/26 |
| 2003/0137056 | A1 * | 7/2003 | Taniguchi et al. | 257/774 |
| 2004/0189170 | A1 | 9/2004 | Aisenbrey | 313/248 |
| 2005/0035366 | A1 | 2/2005 | Imai | 257/100 |
| 2005/0133698 | A1 * | 6/2005 | Oniki et al. | 250/216 |
| 2006/0073639 | A1 * | 4/2006 | Sunohara et al. | 438/118 |
| 2006/0139932 | A1 * | 6/2006 | Park | 362/294 |
| 2006/0289989 | A1 * | 12/2006 | Yee et al. | 257/720 |
| 2008/0087902 | A1 * | 4/2008 | Lee et al. | 257/88 |
| 2009/0026472 | A1 * | 1/2009 | Yasuda et al. | 257/98 |

FOREIGN PATENT DOCUMENTS

| | | |
|---|---|---|
| JP | 11-68263 | 3/1999 |
| JP | 2002-076577 | 3/2002 |
| JP | 2003-060142 | 2/2003 |
| JP | 2004-207367 A1 | 7/2004 |
| JP | 2005-116990 A1 | 4/2005 |
| JP | 2007-035788 | 2/2007 |

OTHER PUBLICATIONS

European Search Report dated Oct. 22, 2010.

(Continued)

*Primary Examiner* — Cuong Q Nguyen
*Assistant Examiner* — Yosef Gebreyesus
(74) *Attorney, Agent, or Firm* — Kratz, Quintos & Hanson, LLP

(57) ABSTRACT

A heat radiation package of the present invention includes a substrate in an upper surface side of which recess portion is provided, embedded wiring portion which is filled in the recess portion of the substrate and on which semiconductor element which generates a heat is mounted, and a heat sink connected to a lower surface side of the substrate. The substrate is made of silicon, ceramics, or insulating resin.

14 Claims, 5 Drawing Sheets

OTHER PUBLICATIONS

Communication received from the European Patent Office mailed Jan. 18, 2012 in counterpart application No. 08 161 025.8-1232 (5 pages).

Notice of Reason of Rejection received in counterpart application No. 2007-208883 from the Japanese Patent Office mailed Aug. 14, 2012 with English translation (6 pages).

* cited by examiner

HEAT RADIATION PACKAGE AND SEMICONDUCTOR DEVICE

CROSS-REFERENCE TO RELATED APPLICATIONS

This application is based on and claims priority of Japanese Patent Application No. 2007-208883 filed on Aug. 10, 2007, the entire contents of which are incorporated herein by reference.

BACKGROUND OF THE INVENTION

1. Field of the Invention

The present invention relates to a heat radiation package and a semiconductor device and, more particularly, a heat radiation package in which a semiconductor element such as light emitting element, or the like, which generates a heat, is mounted and a semiconductor device using the same.

2. Description of the Related Art

In the prior art, there is the heat radiation package used for mounting a light emitting element which generates a heat. As the technology related to such heat radiation package, in Patent Literature 1 (Patent Application Publication (KOKAI) 2005-116990), it is set forth that LED element is mounted on a metal base portion, to which a metal reflecting mirror acting as a reflecting mirror/radiation body is joined, via a submount, thereby a heat from the LED element is guided to the metal base portion and the metal reflecting mirror and is radiated from there.

Also, in Patent Literature 2 (Patent Application Publication (KOKAI) 2004-207367), it is set forth that a light emitting element is mounted on a circuit pattern, which is provided on a ceramic substrate, via gold bumps and also a radiating plate is provided under the ceramic substrate, thereby a heat from the light emitting element is radiated from the radiating plate to the outside via the gold bumps and the ceramic substrate.

However, in the case where the semiconductor element (for example, LED) whose heat radiation is high, in the system that a heat is radiated from the heat radiating portion to the outside while using the ceramic substrate as a heat diffusion path, as set forth in Patent Literature 2, in many cases a heat diffusion from an insulating substrate cannot sufficiently follow up an amount of heat generation. Therefore, such a problem exists that heat radiation performance of the overall package cannot be attained sufficiently.

SUMMARY OF THE INVENTION

It is an object of the present invention to provide a heat radiation package capable of obtaining enough heat radiation performance even when semiconductor element whose heat generation is high is mounted, and a semiconductor device using the same.

The present invention is relevant to a heat radiation package, which includes a substrate in an upper surface side of which recess portion is provided; embedded wiring portion which is filled in the recess portion of the substrate, and on which semiconductor element which generates a heat is mounted; and a heat sink connected to a lower surface side of the substrate.

In the heat radiation package of the present invention, the wiring substrate on which the semiconductor element (light emitting element, or the like) which generates a heat is mounted, is constructed by filling the thick embedded wiring portion in the recess portion of the substrate. The embedded wiring portion is made of a metal such as a copper, or the like, a thermal conductivity of which is high (400 W/mK).

By this matter, when viewed in the thickness direction of the wiring substrate, the wiring substrate is constructed such that the upper main portion is formed of the embedded wiring portion whose thermal conductivity is high, and also the substrate remains under the embedded wiring portion as the supporting plate. Also, the substrate intervenes between the embedded wiring portions mutually.

In the present invention, the embedded wiring portion is used not only as the wiring layer on which the semiconductor element is mounted, and functions but also as the heat diffusing portion for diffusing smoothly a heat into the heat sink. Therefore, a thermal conduction of the overall wiring substrate can be improved remarkably rather than the case where the wiring layer is formed over the whole plate-like insulating substrate.

Accordingly, even when the light emitting element whose heat generation is high is mounted, a heat diffuses smoothly into the heat sink side from the embedded wiring portion via the substrate, and then a heat is emitted to the outside from the heat sink. As a result, the semiconductor element which generates a heat can be cooled and held at a predetermined temperature, a malfunction or a thermal breakdown of the semiconductor element caused due to the heat can be prevented.

It is preferable that, when the fine embedded wiring portions are needed, the silicon substrate should be employed as the substrate. Otherwise, as the substrate, aluminum nitride ceramics, alumina ceramics, or an insulating resin may be employed.

Also, in the referred mode of the present invention, in order to diffuse smoothly a heat, an area of the embedded wiring portions are set larger (for example, about 2 times) than an area of the semiconductor elements which are to be mounted.

As described above, in the present invention, enough heat radiation performance can be attained even when semiconductor element whose heat generation is high is mounted.

DETAILED DESCRIPTION OF THE PREFERRED EMBODIMENTS

Embodiments of the present invention will be explained with reference to the accompanying drawings hereinafter.

Figure 1:
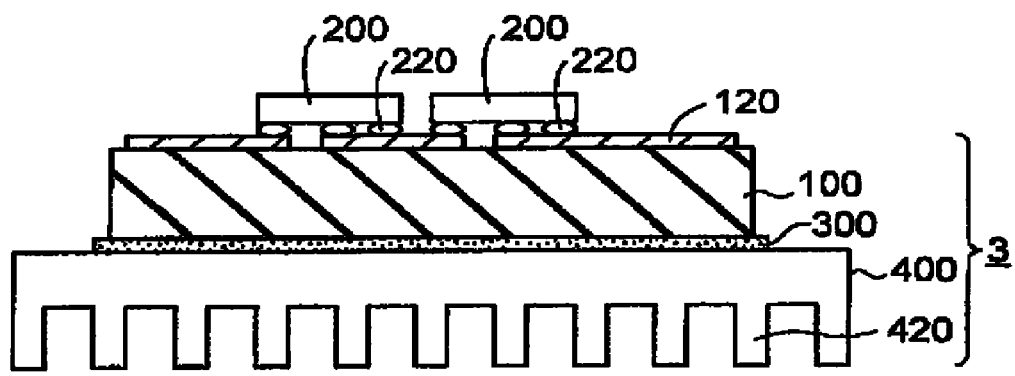
FIG. 1 is a sectional view showing a method of manufacturing a heat radiation package in the related art.

Prior to the explanation of a heat radiation package of the present invention, the problems of the heat radiation package in the related art will be explained hereunder. FIG. 1 is a sectional view showing a method of manufacturing a heat radiation package in the related art.

As shown in FIG. 1, in a heat radiation package 3 in the related art, a wiring layer 120 is provided on an insulating substrate 100. The insulating substrate 100 is formed of an insulating resin, alumina ceramics, or aluminum nitride ceramics. Bumps 220 of light emitting elements 200 (LED, or the like) are mounted to be connected to the wiring layer 120 provided on the insulating substrate 100. A heat sink 400 having a plurality of fins 420 is provided under the insulating substrate 100 via a heat conduction sheet 300. The heat sink 400 is formed of copper or aluminum.

In the heat radiation package 3 in the related art, a heat generated from the light emitting elements 200 is transmitted to the heat sink 400 while using the insulating substrate 100 as the heat diffusion path and is emitted to the outside.

Here, thermal conductivities between the insulating substrate 100 of the heat radiation package 3 in the related art and the heat sink 400 are compared mutually. When the insulating substrate 100 is formed of an insulating resin, its thermal conductivity is 1 W/mK. Also, when the insulating substrate 100 is formed of alumina ceramics, its thermal conductivity is several tens (10 to 30) W/mK. Alternately, when the insulating substrate 100 is formed of aluminum nitride ceramics, its thermal conductivity is 170 W/mK.

On the contrary, in the case where the heat sink 400 is formed of a copper, in view of the fact that its thermal conductivity is 400 W/mK, a thermal conduction of the insulating substrate 100 is considerably inferior as compared with the heat sink 400.

Therefore, a heat generated from the light emitting elements 200 is not sufficiently diffused while diffusing across the insulating substrate 100, and thus a heat is not smoothly transmitted to the heat sink 400 side. In this manner, in the heat radiation package 3 in the related art, the insulating substrate 100 whose thermal conductivity is lower than the metal is interposed in the heat diffusion path in the package. As a result, particularly in mounting the LED whose heat radiation is high, or the like, such a problem exists that the enough heat radiation performance cannot be obtained on account of the influence of the insulating substrate 100.

A heat radiation package of the present embodiment explained hereunder can solve such problem. Next, the heat radiation package of the present embodiment will be explained hereunder.

Figure 2:
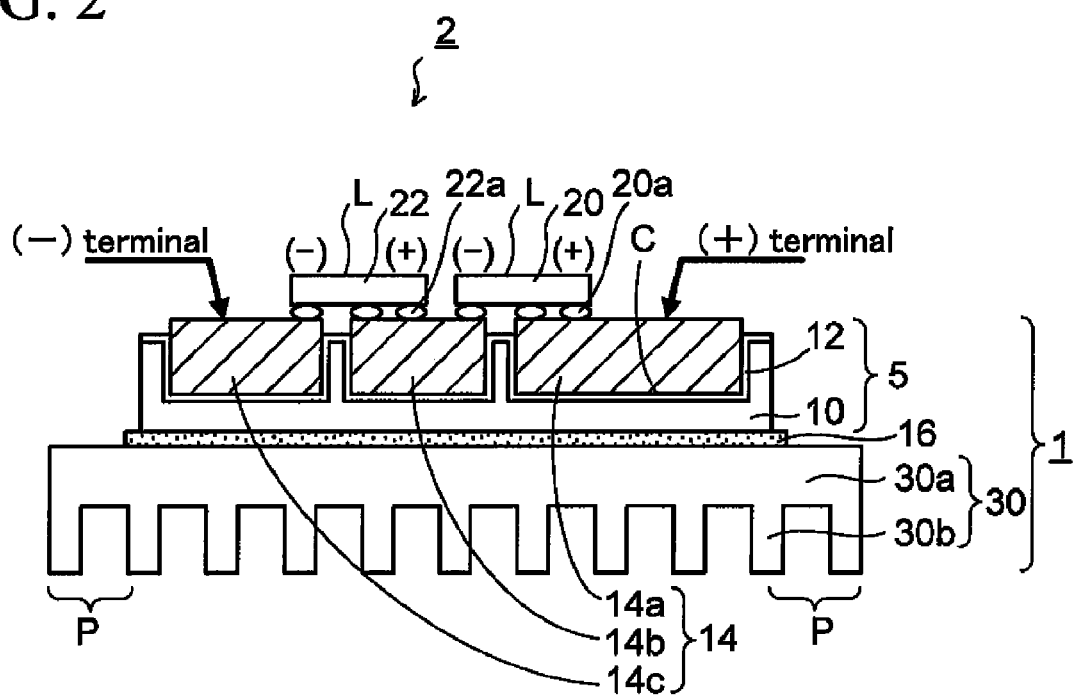
FIG. 2 is a sectional view showing a semiconductor device (heat radiation package) of an embodiment of the present invention.
Figure 3:
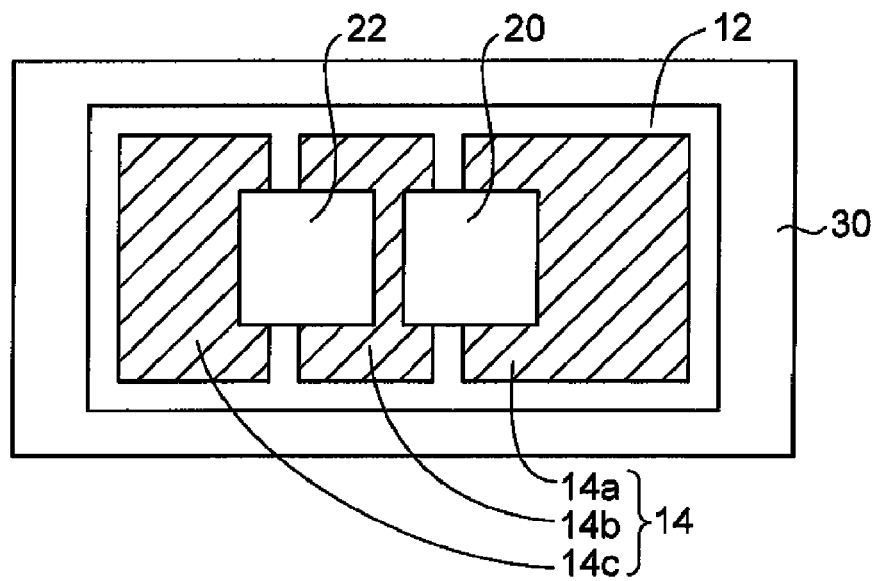
FIG. 3 is a plan view of the semiconductor device in FIG. 2 when viewed from the top.

FIG. 2 is a sectional view showing a heat radiation package of an embodiment of the present invention. FIG. 3 is a plan view of the heat radiation package in FIG. 2 when viewed from the top. As shown in FIG. 2, in a heat radiation package 1 of the present embodiment, a plurality of recess portions C (spot facing) are provided in the upper surface side of a silicon substrate 10.

An insulating layer 12 made of a silicon oxide layer is formed on an upper surface of the silicon substrate 10, containing inner surfaces of the recess portions C. An embedded wiring portion 14 made of a copper, or the like is filled in the recess portions C respectively. The embedded wiring portions 14 and the silicon substrate 10 are insulated electrically with the insulating layer 12. A wiring substrate 5 is constructed by the silicon substrate 10 and the embedded wiring portions 14.

In an example in FIG. 2, first, second, and third embedded wiring portions 14a, 14b, 14c are filled in three recess portions C provided on the silicon substrate 10 respectively. Also, upper surfaces of the embedded wiring portions 14 may be protruded from an upper surface of the insulating layer 12 on the silicon substrate 10 like the example in FIG. 2, or upper surfaces of the embedded wiring portions 14 may be planarized at the same height (coplanar surfaces) as the upper surface of the insulating layer 12 on the silicon substrate 10.

A thickness of the silicon substrate 10 is set to 200 to 700 µm, and a thickness of the embedded wiring portion 14 is set to 50 to 300 µm. A depth of the recess portion C in the silicon substrate 10 is decided in consideration of a thickness of the embedded wiring portion 14, and is set equal to or shallower than a thickness of the embedded wiring portion 14.

As described later, the embedded wiring portions 14 and the silicon substrate 10 constitute the heat diffusion paths downwardly. A thermal conductivity of the embedded wiring portion 14 (in the case of copper) is 400 W/mK, and a thermal conductivity of the silicon substrate 10 is 140 W/mK that is lower than a thermal conductivity of the embedded wiring portion 14. Therefore, in order to diffuse smoothly a heat toward the lower side, a thickness of the embedded wiring portion 14 must be set thicker than a thickness of the underlying silicon substrate 10.

Also, a heat conduction sheet 16 whose thermal conduction is enhanced by dispersing silver (Ag) fillers, or the like is provided on the lower surface of the silicon substrate 10. A heat sink 30 (radiating portion) made of copper, aluminum, or the like is provided under the heat conduction sheet 16. The heat sink 30 is constructed by a base substance portion 30a and a plurality of fins 30b protruded from the base substance portion 30a downward.

The heat sink 30 is provided to have a larger area than the silicon substrate 10. A protruded portion P that extends outward from the periphery of the silicon substrate 10 to the outside is provided. The heat sink 30 increases its surface area by using the fins 30b, thereby a cooling effect caused by airflow is enhance.

The heat sink 30 may be fitted directly to the lower surface of the silicon substrate 10 via the heat conduction sheet 16 like the example in FIG. 2. Otherwise, a thin-film sheet-like heat pipe having a high thermal conductivity may be extended from the lower surface of the silicon substrate 10 to the outside, and then the heat sink 30 may be fitted to its end portion.

In this manner, the heat radiation package 1 of the present embodiment is constructed basically by the wiring substrate 5 composed of the silicon substrate 10 and the embedded wiring portions 14 filled in the recess portions C, the heat conduction sheet 16 provided under the silicon substrate 10, and the heat sink 30 provided under the heat conduction sheet 16.

Also, respective connecting connection terminals 20a, 22a such as gold bumps or the like, of a first light emitting element 20 and a second light emitting element 22 are mounted to be connected the embedded wiring portions 14 respectively. Alternately, respective connection electrodes of the first and second light emitting elements 20, 22 may be connected to the connection terminals 20a, 22a provided on the embedded wiring portions 14.

Each of the first and second light emitting elements 20, 22 has a plus (+) electrode and a minus (−) electrode. The plus (+) electrode of the first light emitting element 20 is connected to the first embedded wiring portion 14a to which a plus (+) terminal of an external circuit is connected, and the minus (−) electrode thereof is connected to the second embedded wiring portion 14b. Also, the minus (−) electrode of the second light emitting element 22 is connected to the third embedded wiring portion 14c to which a minus (−) terminal of the external circuit is connected, and the plus (+) electrode thereof is connected to the second embedded wiring portion 14b.

In this manner, the first light emitting element 20 and the second light emitting element 22 are connected electrically in series and are mounted. Also, the first and second light emitting element 20, 22 are mounted to direct their light emitting portions L to the upper side, as a consequence a light is emitted to the upper side.

As described above, a semiconductor device 2 of the present embodiment is constructed by mounting the first and second light emitting elements 20, 22 on the embedded wiring portions 14 of the heat radiation package 1.

In the semiconductor device 2 of the present embodiment, as the wirings (electrodes) to which the first and second light emitting elements 20, 22 are connected, the embedded wiring portions 14 whose thickness is thick and whose volume is large are formed to be filled in the recess portions C of the silicon substrate 10. The embedded wiring portions 14 are formed of a copper (400 W/mK) whose thermal conductivity is high, or the like.

That is, the wiring substrate 5 is constructed such that, when viewed in the thickness direction, the upper main portion is formed of the embedded wiring portions 14 whose thermal conductivity is high and also the silicon substrate 10 still remains under the embedded wiring portions 14 as the supporting plate. Also, because the recess portions C are provided in the silicon substrate 10, the silicon substrate 10 is interposed between the embedded wiring portions 14 mutually.

Also, by further reference to FIG. 3 (plan view), the first to third embedded wiring portions 14a to 14c are provided like a quadrangular shape respectively, and a total area of them is set larger than a total area of the first and second light emitting elements 20, 22 (for example, two times to five times).

In this manner, in the present embodiment, the embedded wiring portions 14 are used not only as the wirings (electrodes) on which the light emitting elements 20, 22 are mounted but also as the heat diffusing portion that diffuses smoothly a heat into the heat sink 30.

A thermal conductivity (140 W/mK) of the silicon substrate 10 is lower than a thermal conductivity (400 W/mK) of the embedded wiring portions 14 (copper), nevertheless the silicon substrate 10 having a lowest minimum thickness that allows to function as the supporting plate can be set to remain between the embedded wiring portions 14 and the heat sink 30 by providing the recess portions C. Therefore, a thermal conduction of the overall wiring substrate 5 (the silicon substrate 10 and the embedded wiring portions 14) can be improved remarkably rather than the case where the wiring layer 120 is formed on the overall plate-like insulating substrate 100 in the related art.

In the heat radiation package 1 constructed in this manner, first, a heat generated from the first and second light emitting elements 20, 22 diffuses into the embedded wiring portions 14 via the connection terminals 20a, 22a (gold bumps). At this time, the embedded wiring portions 14 are made of a copper whose thermal conductivity is high, or the like, whose thickness is thick, and whose area (volume) is large. Thus, a heat from the first and second light emitting elements 20, 22 diffuses smoothly into the embedded wiring portions 14. Then, a heat transmitted through the embedded wiring portions 14 diffuses into the silicon substrate 10.

In this event, because the silicon substrate 10 exists between the embedded wiring portions 14, a heat passing through the embedded wiring portions 14 diffuses into not only the silicon substrate 10 in the lower direction of the embedded wiring portion 14 but also the silicon substrate 10 in the side direction of the embedded wiring portions 14, thus the heat diffuses effectively. A substantial thickness of the silicon substrate 10 in the bottom areas of the recess portions C is reduced considerably by providing the recess portions C. Thus, a heat diffuses smoothly into the heat conduction sheet 16 side without heat stagnation. Then, a heat which diffuses through the heat conduction sheet 16 diffuses into the heat sink 30 and is emitted to the outside from there.

In the semiconductor device 2 of the present embodiment, the embedded wiring portions 14 acting as the heat diffusing portion whose thermal conduction is high are provided under the light emitting elements. Therefore, even when the light emitting elements such as LED whose heat radiation is high are mounted, the light emitting elements 20, 22 can be cooled sufficiently. As a result, a malfunction or a thermal breakdown caused by the heat generation can be prevented, and thus reliability can be improved.

In this case, also a cooling ability can be improved much more by air-cooling forcibly to provide an electric fan under the heat sink 30.

Figure 4:
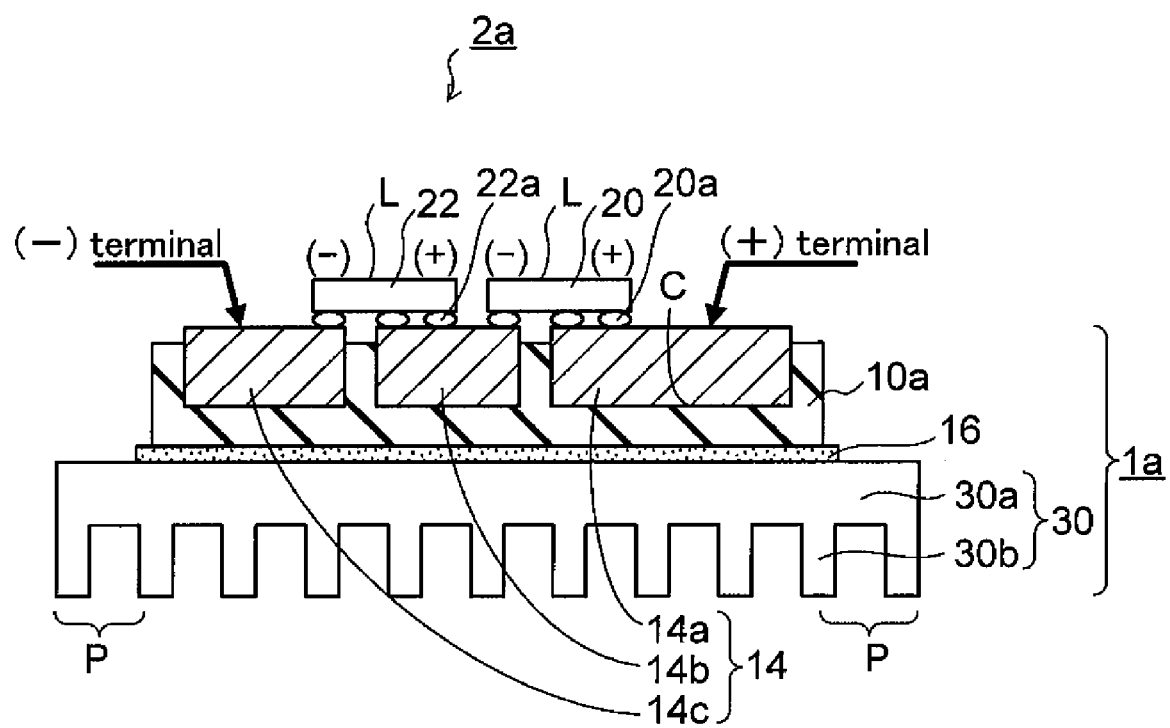
FIG. 4 is a sectional view showing a semiconductor device (heat radiation package) of a variation of the embodiment of the present invention.

A semiconductor device 2a of a variation of the present embodiment is shown in FIG. 4. In a heat radiation package 1a of the semiconductor device 2a of the present variation, an insulating substrate 10a is used in place of the silicon substrate 10, and a plurality of recess portions C are provided in its upper surface side. Also, the similar embedded wiring portions 14 are filled in the recess portions C of the insulating substrate 10a.

As the material of the insulating substrate 10a, aluminum nitride ceramics (thermal conductivity: 170 W/mK), alumina ceramics (thermal conductivity: several tens W/mK), insulating resin (thermal conductivity: 1 W/mK), or the like is employed. In the case where the semiconductor element which is easy to generate a heat is mounted, it is preferable that aluminum nitride ceramics having a high thermal conductivity should be employed as the insulating substrate 10a. In case where the insulating substrate 10a is employed, the above insulating layer 12 in FIG. 2 is omitted. Other elements are similar to those of the semiconductor device 2 in FIG. 2, and therefore their explanation will be omitted by affixing the same reference symbols to them.

The semiconductor device 2a of the present variation can achieve the similar advantage to those of the semiconductor device 2 in FIG. 2.

Here, in the present embodiment, the light emitting elements (LED, or the like) are illustrated as the semiconductor element which generates a heat. But the heat radiation package of the present embodiment can be used effectively as the heat radiation package for various semiconductor elements (LSI chip) generating the heat such as CPU device, and the like.

Figure 5A:
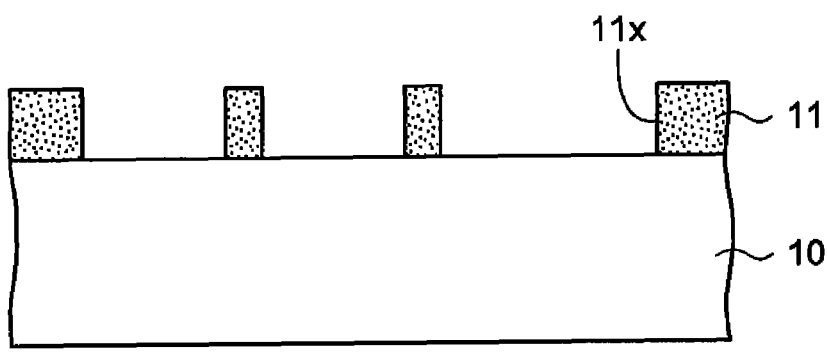
FIGS. 5A to 5H are sectional views showing a method of manufacturing a wiring substrate of the heat radiation package of the embodiment of the present invention.

Next, a method of manufacturing the above-mentioned wiring substrate 5 of the heat radiation package 1 in FIG. 2 will be explained. As shown in FIG. 5A, first, the wafer-like silicon substrate 10 whose thickness is about 700 μm is prepared, and then a mask layer 11 such as a resist, or the like, in which opening portions 11x are provided, is formed on the silicon substrate 10. The opening portions 11x of the mask layer 11 are arranged to correspond to the recess portions C of the above silicon substrate 10.

Then, the dry etching is applied to the silicon substrate 10 through the opening portions 11x of the mask layer 11. Thus, the silicon substrate 10 is etched to halfway of its thickness. Then, the mask layer 11 is removed.

Figure 5B:
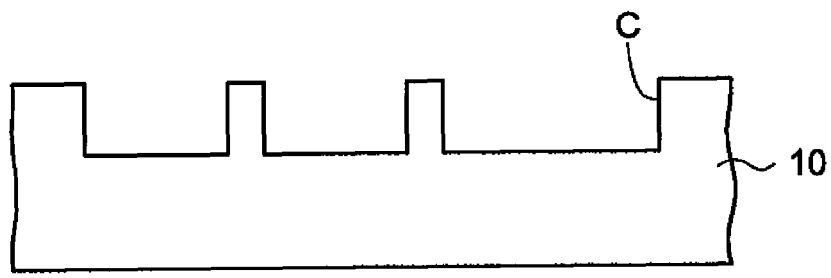

Accordingly, as shown in FIG. 5B, a plurality of recess portions C are formed in the silicon substrate 10.

Figure 5C:
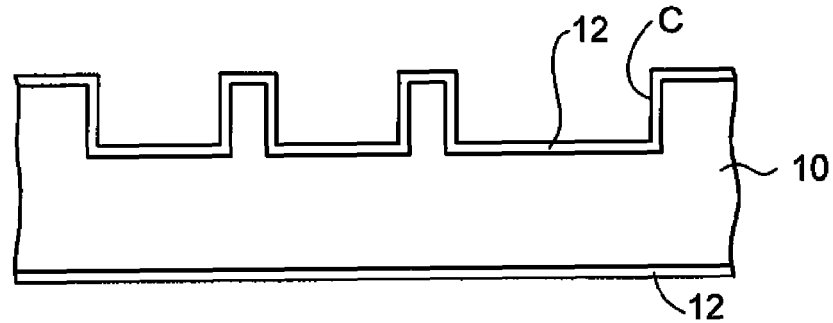

Then, as shown in FIG. 5C, a silicon oxide layer is formed on an upper surface containing inner surfaces of the recess portions C and a lower surface of the silicon substrate 10 by thermally oxidizing the silicon substrate 10. Thus, the insulating layer 12 is obtained. Here, a silicon oxide layer may be formed on the upper surface side or both surface sides of the silicon substrate 10 by the CVD method as the insulating layer 12.

Figure 5D:
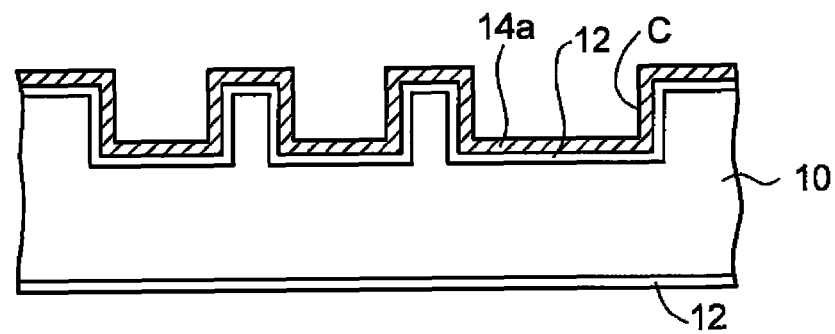
Figure 5E:
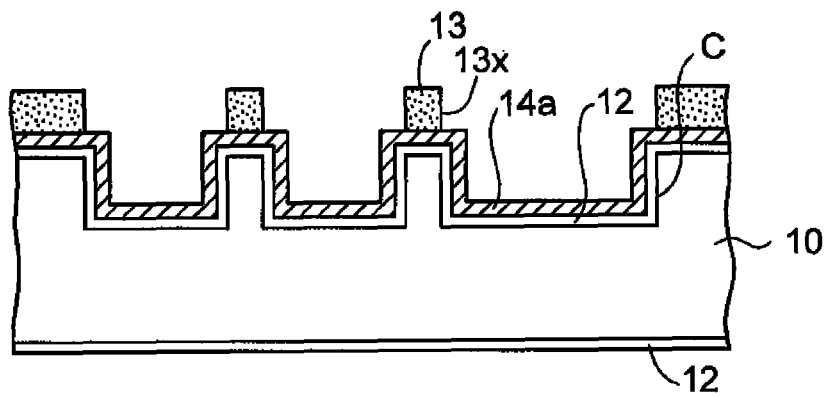

Then, as shown in FIG. 5D, the seed layer 14a made of copper, or the like is formed on the upper surface side of the silicon substrate containing inner surfaces of the recess portions C by sputtering method. Then, as shown in FIG. 5E, a plating resist 13 in which opening portions 13x are provided in portions that correspond to the recess portions C of the silicon substrate 10 is formed on the seed layer 14a.

Figure 5F:
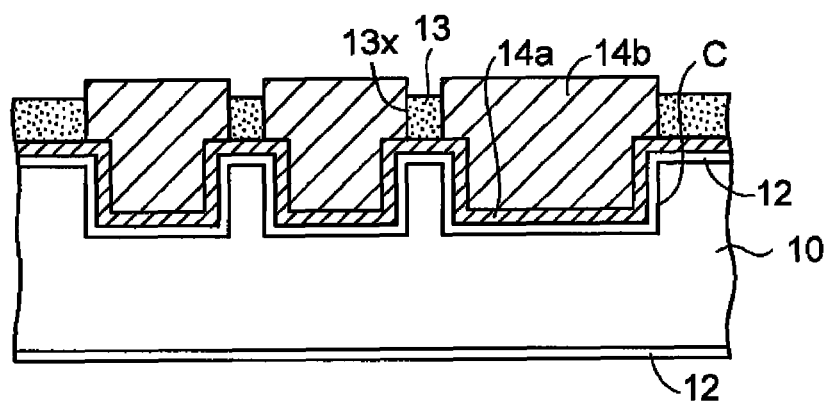
Figure 5G:
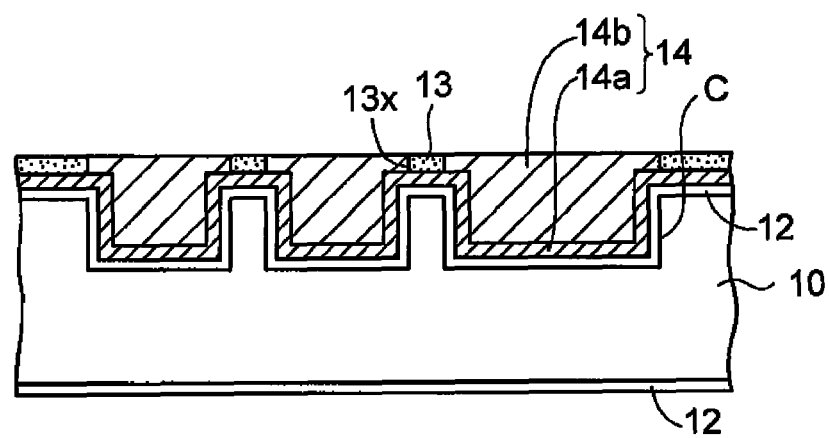

Then, as shown in FIG.5F, the electroplating is applied to the silicon substrate 10 by utilizing the seed layer 14a as a plating power feeding path. Thus, the metal plating layer 14b made of copper, or the like is formed in the opening portions 13x of the plating resist 13. The metal plating layers 14b are formed to protrude from an upper surface of the plating resist 13. Then, as shown in FIG. 5G, the metal plating layers 14b and the plating resist 13 are polished by CMP to planarize the upper surface side, and also a height of the metal plating layers 14b is adjusted at a predetermined height.

Figure 5H:
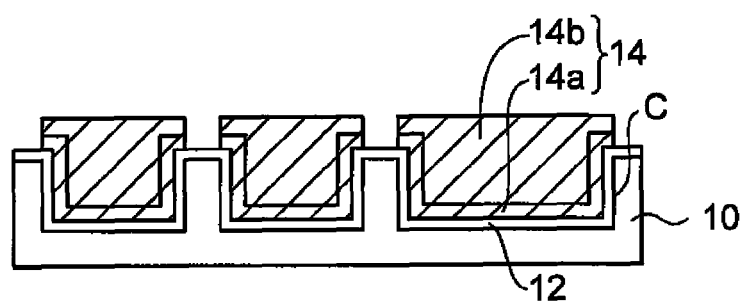

Then, as shown in FIG. 5H, the plating resist 13 is removed. Then, the seed layer 14a is etched by using the metal plating layers 14b as a mask. Thus, the embedded wiring portions 14 each composed of the seed layer 14a and the metal plating layers 14b are obtained. Then, the back surface side of the silicon substrate 10 is ground by the grinder such that a thickness of the silicon substrate 10 is adjusted to a predetermined thickness. Then, the silicon substrate 10 is divided by the cutting to get individual wiring substrates 5. Then, the heat sink 30 is mounted on the lower surface of the wiring substrate 5 via the heat conduction sheet 16.

Since the fine patterning can be applied to the silicon substrate 10 by the wafer process (the photolithography and the dry etching, and the like), a miniaturization of the embedded wiring portions 14 can be implemented in contrast to the case where the ceramics or the insulating resin is used as the substrate. Therefore, not only the pad-like embedded wiring portions 14 as shown in FIG. 2 can be formed, but also the embedded wiring portions 14 as the fine wirings can be drawn around with a narrow pitch. As a result, the package of the present embodiment can be used as the mounting substrate (heat radiation package) for the higher-performance semiconductor device.

What is calimed is:

1. A heat radiation package for a semiconductor element which generates heat, the heat radiation package comprising:
   a substrate;
   a plurality of recess portions provided in an upper surface side of the substrate such that the substrate is left continuous across a respective bottom surface of each of the plurality of recess portions;
   an embedded wiring portion which is respectively filled in a whole of a depth direction and a whole of a width direction of said plurality of recess portions of the substrate, and on which the semiconductor element which generates heat is to be mounted,
   wherein the embedded wiring portion is electrically connected to the semiconductor element mounted thereon; and
   a heat sink connected to a lower surface side of the substrate;
   wherein the substrate is interposed between the adjacent recess portions, and a thickness of the respective embedded wiring portions is set thicker than a thickness of the substrate between a lower surface of the embedded wiring portion and a lower surface of the substrate.

2. A heat radiation package according to claim 1, wherein the substrate is a silicon substrate, and an insulating layer is formed on inner surface of the recess portion.

3. A heat radiation package according to claim 1, wherein the substrate is made of aluminum nitride ceramics, alumina ceramics, or an insulating resin.

4. A heat radiation package according to claim 1, wherein a thickness of the embedded wiring portions is 50 to 300 μm.

5. A heat radiation package according to claim 1, wherein an area of the embedded wiring portion exposed from the substrate is set larger than an area of an upper surface of the semiconductor element which is mounted.

6. A heat radiation package according to claim 1, wherein the heat sink is fitted directly to a lower portion of the substrate via a heat conduction sheet.

7. A semiconductor device, comprising:
   the heat radiation package set forth claim 1 and the semiconductor element.

8. A semiconductor device according to claim 7, wherein the semiconductor element is a light emitting element, and the light emitting element is mounted such that a light emitting portion thereof is directed upward.

9. A heat radiation package according to claim 1, wherein the embedded wiring portion protrudes to an upper side from an upper surface of the substrate with a predetermined height.

10. A heat radiation package according to claim 1, comprising the semiconductor element, and wherein the embedded wiring portion is directly and physically connected to the semiconductor element.

11. A heat radiation package according to claim 1, comprising the semiconductor element,
   wherein the embedded wiring portion comprises a plurality of embedded wiring portions which are respectively filled into said plurality of recess portions,
      wherein each the plurality of embedded wiring portions is electrically connected to the semiconductor element, and
      wherein connection terminals of the semiconductor element are in direct contact with respective ones of the plurality of embedded wiring portions.

12. A heat radiation package according to claim 11, wherein
   the semiconductor element comprises a plus electrode and a minus electrode,
   the plus electrode is electrically connected to a first embedded wiring portion to which a plus terminal of an external circuit is connected, and
   the minus electrode is electrically connected to a second embedded wiring portion to which a minus terminal of the external circuit is connected.

13. A heat radiation package according to claim 12, comprising a plurality of the semiconductor element, wherein one of the semiconductor elements includes both plus and minus connection terminals in contact with a single one of the embedded wiring portions.

14. A heat radiation package according to claim 13, wherein the semiconductor elements are connected electrically in series.

* * * * *